(12) United States Patent
Lin et al.

(10) Patent No.: US 11,177,334 B2
(45) Date of Patent: Nov. 16, 2021

(54) DISPLAY SUBSTRATE, DISPLAY PANEL AND METHOD OF FABRICATING DISPLAY SUBSTRATE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Liang Lin, Beijing (CN); Yunhai Wan, Beijing (CN); Zhixiang Zou, Beijing (CN); Chuan Chen, Beijing (CN); Wei He, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 112 days.

(21) Appl. No.: 16/598,675

(22) Filed: Oct. 10, 2019

(65) Prior Publication Data

US 2020/0273888 A1 Aug. 27, 2020

(30) Foreign Application Priority Data

Feb. 21, 2019 (CN) .......................... 201910129191.4

(51) Int. Cl.
*H01L 27/32* (2006.01)
*H01L 27/12* (2006.01)
(Continued)

(52) U.S. Cl.
CPC .......... *H01L 27/3272* (2013.01); *G02F 1/135* (2013.01); *H01L 27/1214* (2013.01);
(Continued)

(58) Field of Classification Search
CPC ............. H01L 27/3272; H01L 27/1214; H01L 27/1251; H01L 29/78633; H01L 29/786;
(Continued)

(56) References Cited

U.S. PATENT DOCUMENTS

2007/0065995 A1\* 3/2007 Arao ................. H01L 29/66757
438/149
2018/0122835 A1\* 5/2018 Watakabe ........... H01L 27/1251

FOREIGN PATENT DOCUMENTS

CN 109037242 A 12/2018
CN 109148482 A 1/2019

OTHER PUBLICATIONS

First Office Action dated Jun. 23, 2020, for corresponding Chinese application 201910129191.4.

\* cited by examiner

*Primary Examiner* — Jose R Diaz
(74) *Attorney, Agent, or Firm* — Nath, Goldberg & Meyer; Joshua B. Goldberg

(57) ABSTRACT

A display substrate, display panel, and method of fabricating the display substrate. The display substrate includes: a first thin film transistor on a substrate; a second thin film transistor on the substrate and on the same side of the substrate as first thin film transistor; a light blocking structure between the substrate and an active region of first thin film transistor. The light blocking structure is configured to block at least a portion of light incident on the active region of first thin film transistor, such that a ratio of area of an illuminated portion of the active region of first thin film transistor to an area of the active region of first thin film transistor is less than a ratio of area of an illuminated portion of an active region of second thin film transistor to an area of the active region of second thin film transistor.

12 Claims, 5 Drawing Sheets

(51) Int. Cl.
*G02F 1/135* (2006.01)
*H01L 29/786* (2006.01)
*H01L 21/77* (2017.01)

(52) U.S. Cl.
CPC ...... *H01L 27/1218* (2013.01); *H01L 27/1251* (2013.01); *H01L 27/1259* (2013.01); *H01L 29/786* (2013.01); *G02F 1/1351* (2021.01); *H01L 2021/775* (2013.01)

(58) Field of Classification Search
CPC ......... H01L 29/78666; H01L 29/78669; H01L 29/78675; H01L 29/78678; H01L 29/4908; H01L 29/42384; H01L 2021/775; H01L 27/1218; H01L 27/1259; G02F 1/136209
See application file for complete search history.

DISPLAY SUBSTRATE, DISPLAY PANEL AND METHOD OF FABRICATING DISPLAY SUBSTRATE

CROSS-REFERENCE TO RELATED APPLICATION

This application claims priority to Chinese Patent Application No. 201910129191.4, filed on Feb. 21, 2019, the contents of which are incorporated herein by reference in the entirety.

TECHNICAL FIELD

The present disclosure relates to the field of display technology, more particularly, to a display substrate, a display panel and a method of fabricating the display substrate.

BACKGROUND

Thin film transistors are widely used in display substrates of display devices, such as liquid crystal display devices and organic light emitting diode display devices, due to their excellent performance. A part (mainly thin film transistors in a display region) of thin film transistors in the display substrate are in a negative bias state for most of the time when they are turned on, and another part (mainly thin film transistor in a gate driving circuit) of the thin film transistors are in a positive bias state for most of the time when they are turned on, where the negative bias state means that a source/drain voltage (Vs) is higher than a gate voltage (Vg), and the positive bias voltage state means that the gate voltage (Vg) is higher than the source/drain voltage (Vs).

SUMMARY

In one aspect, the present disclosure provides a display substrate, including: a first thin film transistor on a substrate, a second thin film transistor on the substrate and on the same side of the substrate as the first thin film transistor, and a light blocking structure between the substrate and an active region of the first thin film transistor. The light blocking structure is configured to block at least a portion of light that is incident on the active region of the first thin film transistor, such that a ratio of an area of an illuminated portion of the active region of the first thin film transistor to an area of the active region of the first thin film transistor is less than a ratio of an area of an illuminated portion of an active region of the second thin film transistor to an area of the active region of the second thin film transistor.

According to embodiments of the present disclosure, an orthographic projection of the light blocking structure on the substrate covers an orthographic projection of the active region of the first thin film transistor on the substrate.

According to embodiments of the present disclosure, a gate electrode of the second thin film transistor is on a side of the active region of the second thin film transistor away from the substrate.

According to embodiments of the present disclosure, the active region of the second thin film transistor is on a side of a gate electrode of the second thin film transistor away from the substrate, a ratio of an area of the orthographic projection of the active region of the first thin film transistor on the substrate to an area of the orthographic projection of the light blocking structure on the substrate is a first area ratio, a ratio of an area of an orthographic projection of the gate electrode of the second thin film transistor on the substrate to an area of an orthographic projection of the active region of the second thin film transistor on the substrate is a second area ratio, and the first area ratio is greater than the second area ratio.

According to embodiments of the present disclosure, the light blocking structure is a gate electrode of the first thin film transistor.

According to embodiments of the present disclosure, a gate electrode of the first thin film transistor is on a side of the active region of the first thin film transistor away from the substrate, and the light blocking structure is a light blocking layer between the substrate and the first thin film transistor in a vertical direction.

According to embodiments of the present disclosure, the light blocking layer is in the same layer as the gate electrode of the second thin film transistor.

According to embodiments of the present disclosure, a ratio of a time when the first thin film transistor is under a negative bias to a total operating time of the first thin film transistor is a first time ratio, the first time ratio is greater than or equal to a first preset value, a ratio of a time when the second thin film transistor is under a negative bias to a total operating time of the second thin film transistor is a second time ratio, the second time ratio is less than or equal to a second preset value, and the first preset value is greater than the second preset value.

According to embodiments of the present disclosure, the display substrate includes a display region for display and a driving region in which a gate driving circuit is provided, the first thin film transistor is in the display region, and the second thin film transistor is in the driving region.

According to embodiments of the present disclosure, the first thin film transistor and the second thin film transistor are both N-type thin film transistors.

According to embodiments of the present disclosure, the active region of the first thin film transistor and the active region of the second thin film transistor are each made of a metal oxide semiconductor.

In another aspect, the present disclosure provides a method of fabricating a display substrate, including: forming a first thin film transistor and a second thin film transistor on a substrate. The forming of the first thin film transistor on the substrate includes forming a light blocking structure between the substrate and an active region of the first thin film transistor, the light blocking structure is formed to block at least a portion of light that is incident on the active region of the first thin film transistor, such that a ratio of an area of an illuminated portion of the active region of the first thin film transistor to an area of the active region of the first thin film transistor is less than a ratio of an area of an illuminated portion of an active region of the second thin film transistor to an area of the active region of the second thin film transistor.

According to embodiments of the present disclosure, the light blocking structure is formed such that an orthographic projection of the light blocking structure on the substrate covers an orthographic projection of the active region of the first thin film transistor on the substrate.

According to embodiments of the present disclosure, the first thin film transistor is formed such that a gate electrode of the first thin film transistor is on a side of the active region of the first thin film transistor away from the substrate, the second thin film transistor is formed such that the active region of the second thin film transistor is on a side of a gate electrode of the second thin film transistor away from the substrate, the light blocking structure is a light blocking layer between the substrate and the first thin film transistor, and the light blocking layer is formed to be in the same layer as the gate electrode of the second thin film transistor.

According to embodiments of the present disclosure, the first thin film transistor is formed such that a gate electrode of the first thin film transistor is on a side of the active region of the first thin film transistor away from the substrate, and the second thin film transistor is formed such that a gate electrode of the second thin film transistor is on a side of the active region of the second thin film transistor away from the substrate.

According to embodiments of the present disclosure, the light blocking structure is a gate electrode of the first thin film transistor, and the second thin film transistor is formed such that the active region of the second thin film transistor is on a side of a gate electrode of the second thin film transistor away from the substrate.

According to embodiments of the present disclosure, the light blocking structure is a gate electrode of the first thin film transistor, and the second thin film transistor is formed such that a gate electrode of the second thin film transistor is on a side of the active region of the second thin film transistor away from the substrate.

DETAILED DESCRIPTION

To make those skilled in the art better understand the technical solutions of the present disclosure, the present disclosure will be further described in detail below in conjunction with the accompanying drawings and embodiments. It is noted that the following description of some embodiments has been presented for purposes of illustration and description. It is not intended to be exhaustive or to limit the precise forms disclosed, and the repeated description is omitted in order to avoid redundancy.

In the present application, the phrase "in the same layer" means that two elements are in the same layer in a laminated relationship, but this does not mean that the two elements have a same distance from the substrate and does not mean that other layer structures respectively between the two elements and the substrate are the same. In the present application, the phrase "vertical direction" refers to a direction that is perpendicular to a top surface of the substrate.

Figure 1:
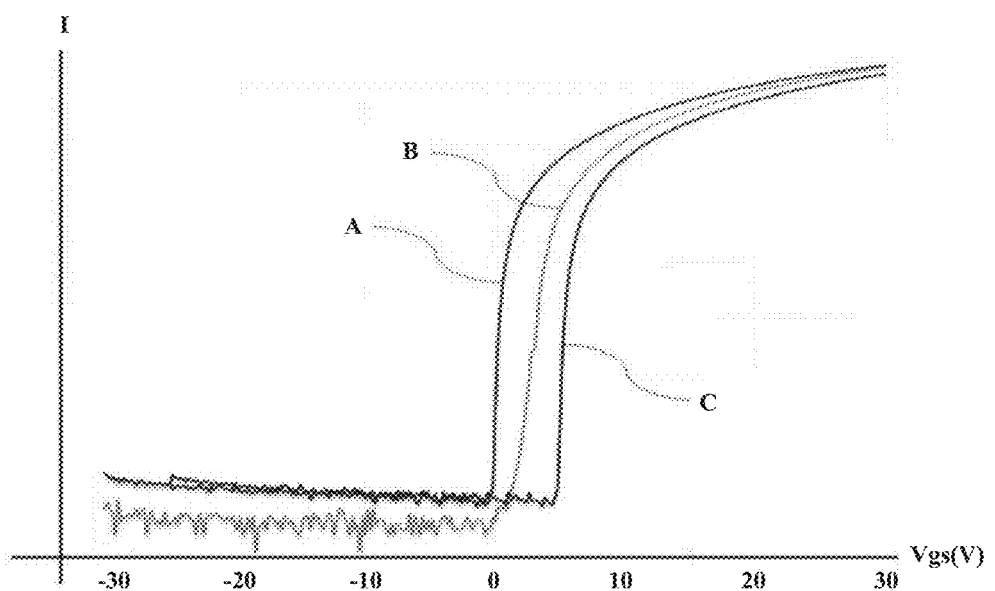
FIG. 1 is a current-voltage (I-Vgs) graph of a thin film transistor under an initial state, a positive bias with illumination and a positive bias without illumination.
Figure 2:
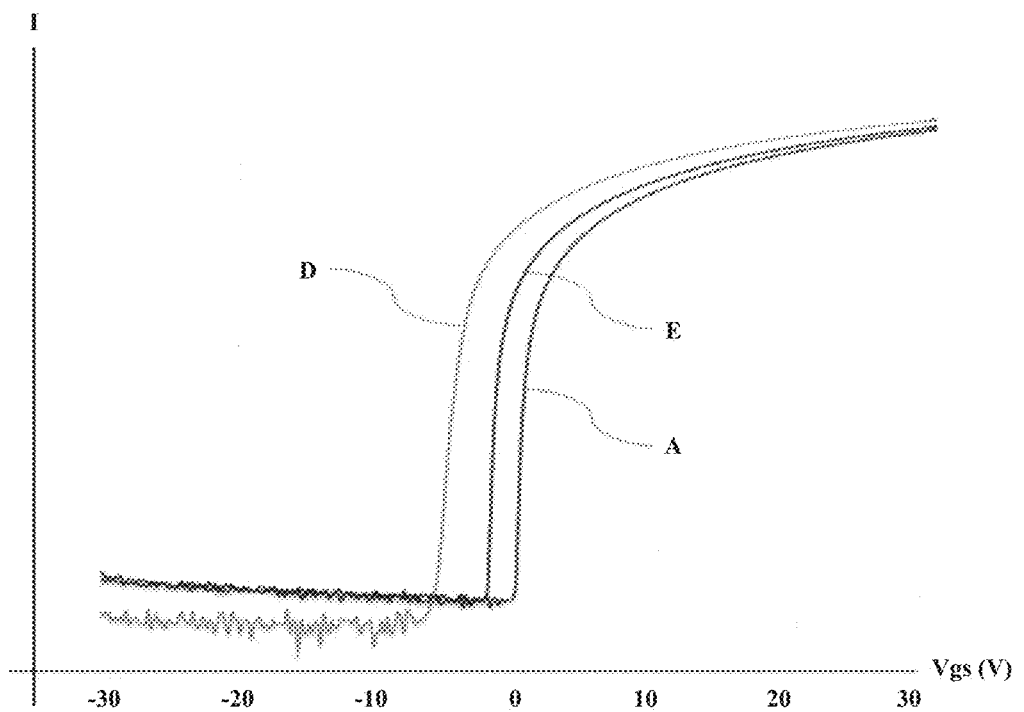
FIG. 2 is a current-voltage (I-Vgs) graph of a thin film transistor under an initial state, a negative bias with illumination and a negative bias without illumination.

FIG. 1 is a current-voltage (I-Vgs) graph of a thin film transistor under an initial state, a positive bias with illumination and a positive bias without illumination, and FIG. 2 is a current-voltage (I-Vgs) graph of a thin film transistor under the initial state, a negative bias with illumination and a negative bias without illumination. Referring to FIGS. 1 and 2, the abscissa indicates a gate-source voltage Vgs, and the ordinate indicates a current I. In FIG. 1, three curves represent a current-voltage curve A of a thin film transistor under the initial state, a current-voltage curve B of the thin film transistor after operating for a period of time under the positive bias with illumination, and a current-voltage curve C of the thin film transistor after operating for a period of time under the positive bias without illumination, respectively. In FIG. 2, three curves represent a current-voltage curve A of the thin film transistor under the initial state, a current-voltage curve D of the thin film transistor after operating for a period of time under the negative bias with illumination, and a current-voltage curve E of the thin film transistor after operating for a period of time under the negative bias without illumination, respectively. In FIGS. 1 and 2, a voltage corresponding to the inflection point of the curve A is a threshold voltage Vth of the thin film transistor, and a difference between a voltage corresponding to each inflection point of other curves and the voltage corresponding to the inflection point of the curve A represents a drift of the threshold voltage. Here, for the sake of clarity, the threshold voltage of the thin film transistor under the initial state is defined as 0V, but it does not mean that the actual value of the threshold voltage is 0V.

It can be seen from FIGS. 1 and 2, the electrical characteristics of the thin film transistor may change with its use, and the illumination and bias states may affect the above changes. Specifically, variations in characteristics (such as threshold voltage drift) of the thin film transistor under the positive bias with illumination may be suppressed, and variations in characteristics of the thin film transistor under the negative bias with illumination may be increased. The variations in characteristics of the thin film transistor can accelerate the aging of the thin film transistor. Therefore, a part of the thin film transistors and another part of the thin film transistors in the display substrate are likely to be at different degrees of aging, thereby affecting the reliability of the display substrate.

The present disclosure provides a display substrate, a display panel, and a method of fabricating the display substrate that substantially obviate one or more of the problems due to limitations and disadvantages of the related art. According to some embodiments of the present disclosure, the display substrate includes: a first thin film transistor on a substrate, a second thin film transistor on the substrate and on the same side of the substrate as the first thin film transistor, and a light blocking structure between the substrate and an active region of the first thin film transistor. The light blocking structure is configured to block at least a portion of light that is incident on the active region of the first thin film transistor, such that a ratio of an area of an illuminated portion of the active region of the first thin film transistor to an area of the active region of the first thin film transistor is less than a ratio of an area of an illuminated portion of an active region of the second thin film transistor to an area of the active region of the second thin film transistor.

Figure 3:
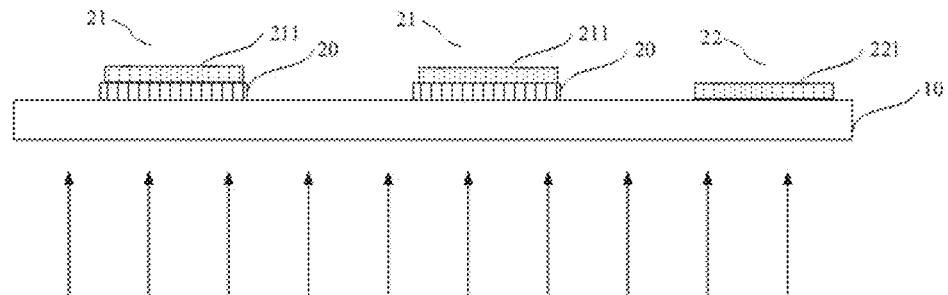
FIG. 3 is a schematic structural view of a display substrate according to embodiments of the present disclosure.

FIG. 3 is a schematic structural view of a display substrate according to embodiments of the present disclosure. Referring to FIG. 3, the display substrate includes a substrate 10, a first thin film transistor 21 and a second thin film transistor 22, and a light blocking structure 20 is disposed between the substrate 10 and an active region 211 of the first thin film transistor 21. The light blocking structure 20 is configured to block at least a portion of light (as indicated by the direction of the arrow) that is incident on the active region 211 of the first thin film transistor 21, such that a ratio of an area of an illuminated portion of the active region 211 of the first thin film transistor 21 to an area of the active region 211 of the first thin film transistor 21 is less than a ratio of an area of an illuminated portion of an active region 221 of the second thin film transistor 22 to an area of the active region 221 of the second thin film transistor 22. In an operating state, a ratio of a time when the first thin film transistor 21 is at the negative bias to its total operating time is a first time ratio, and the first time ratio is greater than or equal to a first preset value. In an operating state, a ratio of a time when the second thin film transistor 22 is at the negative bias to its total operating time is a second time ratio, and the second time ratio is less than or equal to a second preset value. The first preset value is greater than the second preset value.

In the present application, the phrase "a ratio of an area of an illuminated portion of an active region to an area of the active region" refers to a ratio of an area of an orthographic projection of the illuminated portion of the active region on the substrate 10 to an area of an orthographic projection of the whole active region on the substrate 10.

It should be understood that FIG. 3 only schematically shows the positions of the thin film transistors and a relationship between the active region and the light blocking structure 20, and this does not mean that the thin film transistor includes only the active region, and does not mean that the light blocking structure 20 contact the active region or the substrate 10 directly, and so on, either.

Figure 4:
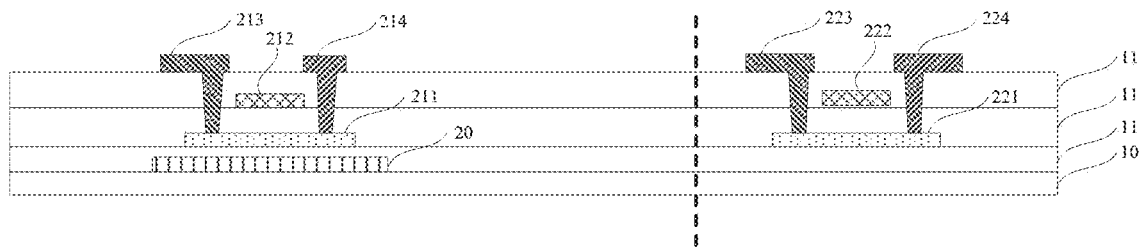
FIG. 4 is a schematic structural view of a display substrate according to embodiments of the present disclosure.

FIGS. 4 to 9 are schematic structural views of a display substrate according to embodiments of the present disclosure. Referring to FIG. 4, the display substrate includes a substrate 10, a light blocking structure 20, a first thin film transistor 21 and a second thin film transistor 22. The light blocking structure 20 is located between the first thin film transistor 21 and the substrate 10, and is spaced apart from the first thin film transistor 21 through an insulating layer 11, the first thin film transistor 21 and the second thin film transistor 22 are located on the same side of the substrate 10, and a plurality of functional layers of the first thin film transistor 21 and the second thin film transistor 22 are spaced apart by a plurality of insulating layers 11, via holes are formed in respective ones of the insulating layers, and the functional layers to be connected are connected with each other through the via holes. Although only one first thin film transistor and one second thin film transistor are shown in FIG. 4, the present disclosure is not limited thereto.

As shown in FIG. 4, in some embodiments, the first thin film transistor 21 includes an active region 211, a gate electrode 212, a first electrode 213 and a second electrode 214 disposed on both sides of the gate electrode 212 and connected to the active region 211 of the first thin film transistor 21 through the via holes. The second thin film transistor 22 includes an active region 221, a gate electrode 222, a first electrode 223 and a second electrode 224 disposed on both sides of the gate electrode 222 and connected to the active region 221 of the second thin film transistor 22 through the via holes. The first electrode of the thin film transistor is one of a source electrode and a drain electrode, and the second electrode is the other of the source electrode and the drain electrode.

In principle, the thin film transistor in an operating state is necessarily either under a positive bias or under a negative bias. A ratio of the time when the first thin film transistor 21 is under the negative bias to its total operating time is the first time ratio, and the first time ratio is greater than a first preset value, for example, the first preset value should be greater than or equal to 70%. For example, the first preset value may be 70%, or more preferably, the first preset value may be one of 80%, 95%, 99%, 99.9%. A ratio of the time when the second thin film transistor 22 is under the negative bias to its total operating time is the second time ratio, the second time ratio is less than a second preset value, and the second preset value is less than the first preset value. Specifically, the second preset value may be one of 50%, 45%, 40%, 30%, etc. Since the first preset value is greater than the second preset value, the first time ratio is necessarily greater than the second time ratio, and a difference between the first time ratio and the second time ratio is necessarily greater than a difference between the first preset value and the second preset value.

As can be seen in conjunction with FIGS. 1 and 2, with the illumination, a suppression of the drift under positive bias is greater than an increase of the drift under negative bias. Therefore, for the first thin film transistor 21 having a relatively large first time ratio, an area ratio of the first thin film transistor 21 to be illuminated should be reduced, thereby reducing the adverse influence of the illumination on the electrical characteristics of the first thin film transistor 21. However, for the second thin film transistor 22 having a relatively small second time ratio (but not necessarily less than 50%), it is possible to maintain or increase the illumination to improve the reliability of the second thin film transistor 22.

In some embodiments, the light blocking structure 20 is disposed between a light incident side (e.g., the substrate 10) of the display substrate and the active region 211 of the first thin film transistor 21 without changing a light source, and the influence of the illumination on the electrical characteristics of the first thin film transistor 21 is reduced by the light blocking structure 20. Specifically, by the light blocking structure 20, a ratio of an area of an illuminated portion of the active region 211 of the first thin film transistor 21 to a total area of the active region 211 is decreased, and the amount of drift of the threshold voltage of the first thin film transistor 21 is reduced, thereby slowing down an aging rate of the first thin film transistor 21 and improving the reliability of the first thin film transistor 21. At the same time, the illumination of the second thin film transistor 22 is maintained or increased. Specifically, a ratio of an area of an illuminated portion of the active region 221 of the second thin film transistor 22 to a total area of the active region 221 is maintained or increased, the influence of illumination on the electrical characteristics of the second thin film transistor 22 is maintained, and the drift of the threshold voltage of the second thin film transistor 22 under the positive bias is suppressed to some extent, thereby improving the reliability of the second thin film transistor 22.

In summary, by providing the light blocking structure between the active region of the first thin film transistor and the substrate, the aging rates of the first thin film transistor 21 and the second thin film transistor 22 are both reduced to some extent, the reliabilities thereof are both improved, and the aging rates of the first thin film transistor 21 and the second thin film transistor 22 can be consistent, thereby improving the overall stability of the display substrate.

In some embodiments, as shown in FIGS. 4-9, an orthographic projection of the light blocking structure 20 on the substrate 10 covers an orthographic projection of the active region 211 of the first thin film transistor 21 on the substrate 10. In this case, the ratio of the area of the illuminated portion of the active region 211 of the first thin film transistor 21 to the total area of the active region 211 is "0%", maximally avoiding the influence of illumination on the electrical characteristics of the first thin film transistor 21, such that the drift of the threshold voltage of the first thin film transistor 21 in the negative bias state is suppressed to the utmost extent, thereby maximally improving the reliability of the first thin film transistor 21.

In some embodiments, as shown in FIGS. 4, 5, 8, and 9, the active region 221 of the second thin film transistor 22 is closer to the light incident side of the display substrate than the gate electrode 222, that is to say, the gate electrode 222 of the second thin film transistor 22 is located on a side of the active region 221 of the second thin film transistor 22 away from the substrate 10. In this case, it prevents the gate electrode 222 of the second thin film transistor 22 from blocking the active region 221. In other words, the ratio of the area of the illuminated portion of the active region 221 of the second thin film transistor 22 to the area of the active region 221 is "100%", and the drift of the threshold voltage of the second thin film transistor 22 in the positive bias state is suppressed to the utmost extent, thereby maximally improving the reliability of the second thin film transistor 22.

Figure 6:
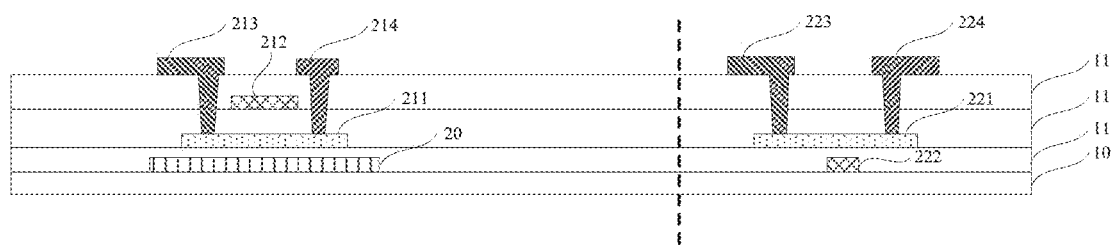
FIG. 6 is a schematic structural view of a display substrate according to embodiments of the present disclosure.
Figure 7:
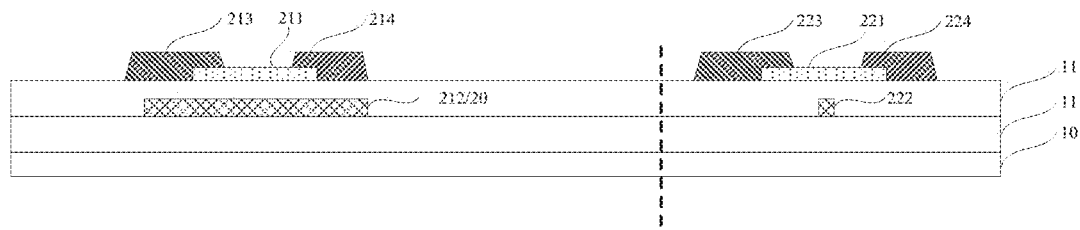
FIG. 7 is a schematic structural view of a display substrate according to embodiments of the present disclosure.

In some embodiments, as shown in FIGS. 6 and 7, the ratio of the area of the orthographic projection of the active region 211 of the first thin film transistor 21 on the substrate 10 to the area of the orthographic projection of the light blocking structure 20 on the substrate 10 is the first area ratio.

For the orthographic projection of the light blocking structure 20 on the substrate 10, a portion thereof overlaps with the orthographic projection of the active region 211 on the substrate 10, and the ratio of the area of the overlapping portion to the total area of the orthographic projection of the light blocking structure 20 on the substrate 10 is the first area ratio.

The gate electrode 222 of the second thin film transistor 22 is closer to the light incident side of the display substrate than the active region 221, that is to say, the active region 221 of the second thin film transistor 22 is located on a side of the gate electrode 222 of the second thin film transistor 22 away from the substrate 10.

The ratio of the area of the orthographic projection of the gate electrode 222 of the second thin film transistor 22 on the substrate 10 to the area of the orthographic projection of the active region 221 of the second thin film transistor 22 on the substrate 10 is the second area ratio.

For the orthographic projection of the active region 221 on the substrate 10, a portion thereof overlaps with the orthographic projection of the gate electrode 222 on the substrate 10, and the ratio of the area of the overlapping portion to the total area of the orthographic projection of the active region 222 on the substrate 10 is the second area ratio. The first area ratio is greater than the second area ratio.

Figure 5:
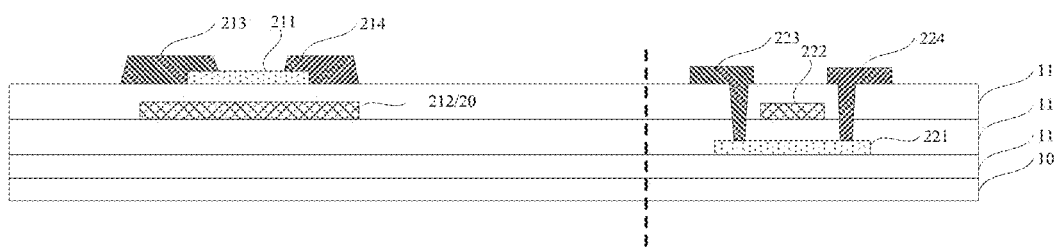
FIG. 5 is a schematic structural view of a display substrate according to embodiments of the present disclosure.
Figure 9:
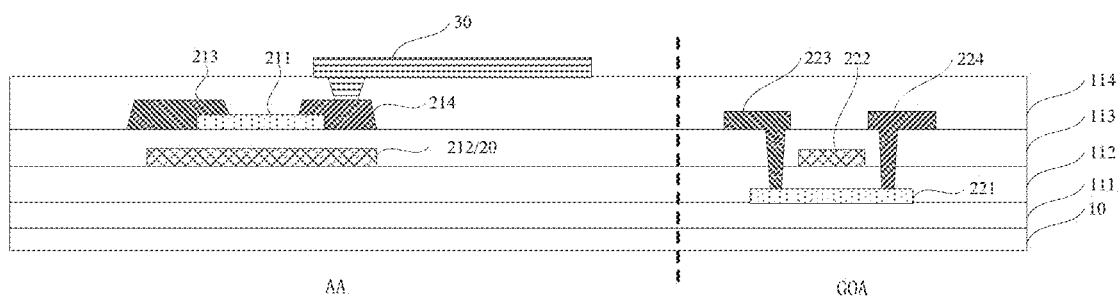
FIG. 9 is a schematic structural view of a display substrate according to embodiments of the present disclosure.

In some embodiments, as shown in FIGS. 5, 7 and 9, the gate electrode 212 of the first thin film transistor 21 also functions as the light blocking structure 20.

In some embodiments, the gate electrode 222 of the second thin film transistor 22 may also be closer to the light incident side of the display substrate than the active region 221, that is to say, the active region 221 of the second thin film transistor 22 is located on a side of the gate electrode 222 of the second thin film transistor 22 away from the substrate 10. Thus, the gate electrode 222 is capable of blocking the light emitted towards the active region 221 of the second thin film transistor 22, that is to say, at least portions of the active region 211 of the first thin film transistor 21 and the active region 221 of the second thin film transistor 22 cannot be illuminated. It can be seen from the above description that, the illumination can accelerate the aging of the first thin film transistor 21 (i.e., increase the drift of the threshold voltage of the first thin film transistor 21 in the negative bias state), and at the same time, the illumination can slow down the aging of the second thin film transistor 22 (i.e., suppress the drift of the threshold voltage of the second thin film transistor 22 in the positive bias state). Therefore, in order to make the aging rates of the first thin film transistor 21 and the second thin film transistor 22 to be consistent, a ratio of an area of a blocked portion of the active region 211 of the first thin film transistor 21 to the total area of the active region 211 (i.e., the first area ratio described above) should be greater than a ratio of an area of a blocked portion of the active region 221 of the second thin film transistor 22 to the total area of the active region 221 (i.e., the second area ratio described above).

In some embodiments, as shown in FIGS. 5, 7 and 9, the gate electrode 212 of the first thin film transistor 21 is closer to the light incident side of the display substrate than the active region 211, that is to say, the active region 211 of the first thin film transistor 21 is located on a side of the gate electrode 212 of the first thin film transistor 21 away from the substrate 10, and the gate electrode 212 of the first thin film transistor 21 also functions as the light blocking structure 20. In other words, the light blocking structure 20 is not separately disposed, and the shape of the gate electrode 212 of the first thin film transistor 21 is changed only. The change of the shape of the gate electrode 212 of the first thin film transistor 21 is simply made by increasing the size of the gate electrode 212 of the first thin film transistor 21, and thus the process is simple. In addition, the solution does not increase the thickness of the display substrate.

Figure 8:
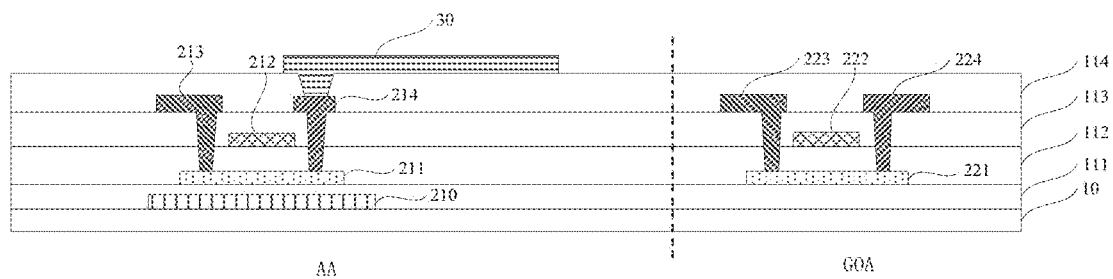
FIG. 8 is a schematic structural view of a display substrate according to embodiments of the present disclosure.

In some embodiments, as shown in FIGS. 4, 6 and 8, the active region 211 of the first thin film transistor 21 is closer to the light incident side of the display substrate than the gate electrode 212, that is to say, the gate electrode 212 of the first thin film transistor 21 is located on a side of the active region 211 of the first thin film transistor 21 away from the substrate 10. In some embodiments, as shown in FIG. 8, the light blocking structure 20 is a light blocking layer 210 disposed between the light incident side of the display substrate and the first thin film transistor 21. In this case, from a structural point of view, the light blocking layer 210 is disposed separately from the first thin film transistor 21 and has no influence on the performance of the first thin film transistor 21 except for receiving light; from a process point of view, only a light blocking layer 210 is added to the original structure, and thus the process is simple.

In some embodiments, as shown in FIGS. 6 and 7, the gate electrode 222 of the second thin film transistor 22 is closer to the light incident side of the display substrate than the active region 221, and the light blocking structure 20 and the gate electrode 222 of the second thin film transistor 22 are disposed in the same layer. In this case, since the light blocking structure 20 and the gate electrode 222 of the second thin film transistor 22 are disposed in the same layer, the thickness of the display substrate is not increased. The gate electrode 222 of the second thin film transistor 22 may be a non-transparent metal layer, and the light blocking structure 20 may be formed by performing a corresponding etching process on the metal layer for forming the gate electrode 222 of the second thin film transistor 22, that is to say, the light blocking structure 20 and the gate electrode 222 of the second thin film transistor 22 can be simultaneously formed by one patterning process, and thus the process is simple. In some embodiments, as shown in FIG. 3, the substrate 10 is closer to the light incident side of the display substrate than the first thin film transistor 21 and the second thin film transistor 22, that is to say, the first thin film transistor 21 and the second thin film transistor 22 are located on a side of the substrate 10 away from the light incident side of the display substrate. In this case, the formation of a plurality of functional layers on the substrate 10 is facilitated, and the substrate 10 is generally of a transparent material, so the light can pass through the substrate 10 better and is irradiated on the active region 221 of the second thin film transistor 22. Further, for the display substrate of the liquid crystal display device, the light is mainly from the backlight and is incident through the substrate 10. In addition, the thin film transistor more generally has a top gate type structure, and thus, when the substrate 10 is used as the light incident side of the display substrate, the top gate type structure is a preferable structure of the second thin film transistor 22.

In the present specification, only a case where the substrate 10 is closer to the light incident side of the display substrate than the first thin film transistor 21 and the second thin film transistor 22 is described, the present disclosure is not limited thereto. The features, aspects and the like in the present disclosure are also applicable to a case where the substrate 10 is farther from the light incident side of the display substrate than the first thin film transistor 21 and the second thin film transistor 22 by means of appropriate modification.

In some embodiments, the structure of the display substrate is similar to that of the display substrate shown in FIG. 8, except that the substrate 10 may be disposed on a fourth insulating layer 114. When the light is incident from the first insulating layer 111 (i.e., the light incident side of the display substrate), the light blocking layer 210 may block light from being incident on the active region 211 of the first thin film transistor 21. In this case, a ratio of the area of the illuminated portion of the active region 211 of the first thin film transistor 21 to the total area of the active region 211 is 0%, thereby maximally avoiding the influence of illumination on the optical characteristics of the first thin film transistor 21, such that the drift of the threshold voltage of the first thin film transistor 21 in the negative bias state is suppressed to the utmost extent, thereby maximally improving the reliability of the first thin film transistor 21.

In some embodiments, as shown in FIGS. 8 and 9, the display substrate may include a display region AA for display and a driving region GOA provided with a gate driving circuit. The first thin film transistor 21 is disposed in the display region AA, the second thin film transistor 22 is disposed in the driving region GOA, and the second electrode 214 of the first thin film transistor 21 may be configured to be connected to a pixel electrode layer 30. That is to say, the display substrate includes two different types of thin film transistors, one is the first thin film transistor 21 disposed in the display region AA, and the other is the second thin film transistor 22 in the gate driving circuit. The thin film transistors at different positions in the display substrate have different functional requirements, and the first thin film transistor 21 and the second thin film transistor 22 have different structures respectively, such that the first thin film transistor 21 and the second thin film transistor 22 can be respectively used at different positions of the array substrate to meet corresponding functional requirements. For example, due to the circuit design, the thin film transistors in the display region AA are usually under a negative bias for a relatively long period of time, and thus the transistors in the display region AA are the first thin film transistors 21. However, the thin film transistors in the driving region GOA are usually under a negative bias for a relatively short period of time, and thus the transistors in the driving region GOA are the second thin film transistors 22, the present disclosure is not limited thereto. In some embodiments, the driving region may be a non-display region that surrounds the whole display region, or may be located in the non-display region.

In addition, a case where the two types of thin film transistors are not divided according to the display region and driving region as required is also feasible.

In some embodiments, the first thin film transistor 21 and the second thin film transistor 22 are both N-type thin film transistors. In this case, the same thin film transistor is used in the display substrate to facilitate fabrication, and the change in electrical characteristics of the N-type thin film transistor under illumination conforms more to the above rules.

In some embodiments, the active region 211 of the first thin film transistor 21 and the active region 221 of the second thin film transistor 22 are each made of a metal oxide semiconductor. In this case, the metal oxide both has good semiconductor characteristics and is sensitive to the illumination, and the change of the electrical characteristics of the thin film transistor whose active region is made of the metal oxide confirms more to the above rule. In other words, when the thin film transistor whose active region is made of the metal oxide is in a positive bias state, the drift of the threshold voltage of the thin film transistor with illumination can be well suppressed. Therefore, a preferable material of the active region 221 of the second thin film transistor 22 is a metal oxide. Further, in order to facilitate the fabrication of the display substrate, the active region 211 of the first thin film transistor 21 and the active region 221 of the second thin film transistor 22 may be formed of the same material.

In another aspect, the present disclosure provides a method of fabricating a display substrate, and the display substrate may be referred to FIGS. 3-9. The method may include: forming a first thin film transistor and a second thin film transistor on a substrate. The forming of the first thin film transistor on the substrate includes forming a light blocking structure between the substrate and an active region of the first thin film transistor; the light blocking structure is formed to block at least a portion of light that is incident on the active region of the first thin film transistor, such that a ratio of an area of an illuminated portion of the active region of the first thin film transistor to an area of the active region of the first thin film transistor is less than a ratio of an area of an illuminated portion of an active region of the second thin film transistor to an area of the active region of the second thin film transistor. In an operating state, a ratio of a time when the first thin film transistor is under a negative bias to its total operating time is a first time ratio, and the first time ratio is greater than or equal to a first preset value. In an operating state, a ratio of a time when the second thin film transistor is under a negative bias to its total operating time is a second time ratio, and the second time ratio is less than or equal to a second preset value. The first preset value is greater than the second preset value.

In some embodiments, the first thin film transistor and the second thin film transistor may be fabricated by a conventional fabricating process, and the fabricating process is simple. As described above, the light blocking structure formed between the substrate and the active region of the first thin film transistor may be either the gate electrode of the first thin film transistor or a light blocking layer disposed between the first thin film transistor and the substrate, and any of the gate electrodes of the first thin film transistor and the light blocking layer can be formed by a simple patterning process. Therefore, the fabricating method of the display substrate provided by the embodiments is reasonable and convenient to implement.

The fabricating method of the display substrate provided by the present disclosure can be used to fabricate the display substrate provided by the present disclosure, and in order to avoid redundancy, the redundant description of the display substrate is not repeated.

In some embodiments, as shown in FIG. 8, a method of fabricating the display substrate according to embodiments of the present disclosure may include the following steps: forming a light blocking layer 210 by using an appropriate mask; forming a first insulating layer 111; forming an active region 211 of a first thin film transistor and an active region 221 of a second thin film transistor; forming a second insulating layer 112; forming a gate electrode 212 of the first thin film transistor and a gate electrode 222 of the second thin film transistor; forming a third insulating layer 113, and forming via holes on the third insulating layer 113 by using an appropriate mask; forming a first electrode 213 and a second electrode 214 of the first thin film transistor; forming a first electrode 223 and a second electrode 224 of the second thin film transistor; forming a fourth insulating layer 114, and forming via holes on the fourth insulating layer 114 by using an appropriate mask; and forming a pixel electrode layer 30.

In some embodiments, as shown in FIG. 9, a method of fabricating the display substrate according to embodiments of the present disclosure may include the following steps: forming a first insulating layer 111; forming an active region 221 of a second thin film transistor; forming a second insulating layer 112; forming a gate electrode 212 of a first thin film transistor and a gate electrode 222 of the second thin film transistor; forming a third insulating layer 113, and forming via holes on the third insulating layer 113 by using an appropriate mask; forming an active region 221 of the second thin film transistor; forming a first electrode 213 and a second electrode 214 of the first thin film transistor; forming a first electrode 223 and a second electrode 224 of the second thin film transistor; forming a fourth insulating layer 114, and forming via holes on the fourth insulating layer 114 by using an appropriate mask; and forming a pixel electrode layer 30.

In another aspect, the present disclosure provides a display panel including the display substrate as described herein or fabricated by the methods described herein. In some embodiments, the display substrate is provided with the first thin film transistor and the second thin film transistor which are of two different operating states, the first thin film transistor is in a negative bias state for most of its operating time, and the second thin film transistor is in a positive bias state for most of its operating time. A light blocking structure is disposed between the active region of the first thin film transistor and a light incident side of the display panel (either the light blocking structure is added separately or the gate electrode of the first thin film transistor serves as the light blocking structure), and shields a part of or all the active region of the first thin film transistor, such that the adverse effect of illumination on the first thin film transistor is reduced by reducing the ratio of the area of the illuminated portion of the active region of the first thin film transistor to the total area of the active region of the first thin film transistor, thereby slowing down the aging rate of the first thin film transistor and improving the reliability of the first thin film transistor. The ratio of the area of the illuminated portion of the active area of the second thin film transistor to the total area of the active area of the second thin film transistor is maintained or increased to enhance the positive influence of the illumination on the second thin film transistor, thereby slowing down the aging rate of the second thin film transistor and improving the reliability of the second thin film transistor. The reliabilities of the first thin film transistor and the second thin film transistor are both improved, and the overall stability of the display panel is also improved. In addition, the above scheme also causes the aging rates of the first thin film transistor and the second thin film transistor to be consistent.

It is to be understood that the above description is only for the purpose of illustrating the principles of the present disclosure, but the disclosure is not limited thereto. Various modifications and improvements can be made by those skilled in the art without departing from the spirit and scope of the disclosure, and such modifications and improvements are also considered to be within the scope of the disclosure.

What is claimed is:

1. A display substrate, comprising:
a first thin film transistor on a substrate;
a second thin film transistor on the substrate and on the same side of the substrate as the first thin film transistor; and
a light blocking structure between the substrate and an active region of the first thin film transistor,
wherein the light blocking structure is configured to block at least a portion of light that is incident on the active region of the first thin film transistor, such that a ratio of an area of an illuminated portion of the active region of the first thin film transistor to an area of the active region of the first thin film transistor is less than a ratio of an area of an illuminated portion of an active region of the second thin film transistor to an area of the active region of the second thin film transistor,
wherein an orthographic projection of the light blocking structure on the substrate covers an orthographic projection of the active region of the first thin film transistor on the substrate,
the active region of the second thin film transistor is on a side of a gate electrode of the second thin film transistor away from the substrate,
a ratio of an area of an orthographic projection of the gate electrode of the second thin film transistor on the substrate to an area of an orthographic projection of the active region of the second thin film transistor on the substrate is a second area ratio, and
the first area ratio is greater than the second area ratio.

2. The display substrate of claim 1, wherein
the light blocking structure is a gate electrode of the first thin film transistor.

3. The display substrate of claim 1, wherein
a gate electrode of the first thin film transistor is on a side of the active region of the first thin film transistor away from the substrate, and
the light blocking structure is a light blocking layer between the substrate and the first thin film transistor in a vertical direction.

4. The display substrate of claim 3, wherein
the light blocking layer is in the same layer as the gate electrode of the second thin film transistor.

5. The display substrate of claim 1, wherein
a ratio of a time when the first thin film transistor is under a negative bias to a total operating time of the first thin film transistor is a first time ratio, and the first time ratio is greater than or equal to a first preset value;
a ratio of a time when the second thin film transistor is under a negative bias to a total operating time of the second thin film transistor is a second time ratio, and the second time ratio is less than or equal to a second preset value; and
the first preset value is greater than the second preset value.

6. The display substrate of claim 5, wherein
the display substrate comprises a display region for display and a driving region in which a gate driving circuit is provided;
wherein the first thin film transistor is in the display region; and
the second thin film transistor is in the driving region.

7. The display substrate of claim 6, wherein
the first thin film transistor and the second thin film transistor are both N-type thin film transistors.

8. The display substrate of claim 7, wherein
the active region of the first thin film transistor and the active region of the second thin film transistor are each made of a metal oxide semiconductor.

9. A display panel, comprising the display substrate of claim 1.

10. A method of fabricating a display substrate, comprising:
forming a first thin film transistor and a second thin film transistor on a substrate;
wherein forming the first thin film transistor on the substrate comprises forming a light blocking structure between the substrate and an active region of the first thin film transistor;
the light blocking structure is formed to block at least a portion of light that is incident on the active region of the first thin film transistor, such that a ratio of an area of an illuminated portion of the active region of the first thin film transistor to an area of the active region of the first thin film transistor is less than a ratio of an area of an illuminated portion of an active region of the second thin film transistor to an area of the active region of the second thin film transistor,
wherein the first thin transistor is formed such that a gate electrode of the first thin film transistor is on a side of the active region of the first film transistor away from the substrate,
the second thin film transistor is formed such that the active region of the second thin film transistor is on a side of a gate electrode of the second thin film transistor away from the substrate,
the light blocking structure is a light blocking layer between the substrate and the first thin film transistor, and
the light blocking layer is formed to be in the same layer as the gate electrode of the second thin film transistor.

11. The method of claim 10, wherein
the light blocking structure is formed such that an orthographic projection of the light blocking structure on the substrate covers an orthographic projection of the active region of the first thin film transistor on the substrate.

12. The method of claim 10, wherein
the light blocking structure is a gate electrode of the first thin film transistor; and
the second thin film transistor is formed such that the active region of the second thin film transistor is on a side of a gate electrode of the second thin film transistor away from the substrate.

* * * * *